United States Patent
Yamamoto et al.

(10) Patent No.: US 10,177,560 B2
(45) Date of Patent: Jan. 8, 2019

(54) BATTERY MONITORING DEVICE (71) Applicant: KABUSHIKI KAISHA TOYOTA JIDOSHOKKI, Aichi (JP)

(72) Inventors: Satoshi Yamamoto, Kariya (JP); Hiroaki Kato, Kariya (JP); Kimihiro Sato, Kariya (JP); Takuya Yamamoto, Kariya (JP); Ryusuke Hase, Kariya (JP); Takahiro Tsuzuku, Kariya (JP)

(73) Assignee: KABUSHIKI KAISHA TOYOTA JIDOSHOKKI, Aichi (JP)

( * ) Notice: Subject to any disclaimer, the term of this patent is extended or adjusted under 35 U.S.C. 154(b) by 127 days.

(21) Appl. No.: 15/300,480

(22) PCT Filed: Apr. 2, 2015

(86) PCT No.: PCT/JP2015/060464
§ 371 (c)(1),
(2) Date: Sep. 29, 2016

(87) PCT Pub. No.: WO2015/156202
PCT Pub. Date: Oct. 15, 2015

(65) Prior Publication Data
US 2017/0125999 A1 May 4, 2017

(30) Foreign Application Priority Data

Apr. 8, 2014 (JP) .................. 2014-079103
May 16, 2014 (JP) .................. 2014-101860

(51) Int. Cl.
*H02H 7/18* (2006.01)
*G01R 31/36* (2006.01)
*H02H 3/05* (2006.01)

(52) U.S. Cl.
CPC .......... *H02H 7/18* (2013.01); *G01R 31/3624* (2013.01); *G01R 31/3679* (2013.01); *H02H 3/05* (2013.01)

(58) Field of Classification Search
CPC ... H02H 7/18; G01R 31/3624; G01R 31/3679
(Continued)

(56) References Cited

U.S. PATENT DOCUMENTS 4,788,619 A * 11/1988 Ott .................. H02H 7/04
340/663
2009/0111005 A1 4/2009 Hur
(Continued)

FOREIGN PATENT DOCUMENTS

JP 10-322916 12/1998
JP 2002-320334 10/2002
(Continued)

OTHER PUBLICATIONS

Search Report issued in International Patent Application No. PCT/JP2015/060464, dated Jun. 23, 2015.

*Primary Examiner* — Kevin J Comber
(74) *Attorney, Agent, or Firm* — Greenblum & Bernstein, P.L.C.

(57) ABSTRACT

A battery monitoring device is configured to include a monitoring unit that monitors a state of a battery, an interrupter that interrupts a power supply to a load, and another interrupter that interrupts a power supply to the interrupter, wherein the monitoring unit controls an operation of the interrupter such that a power supply to the load is interrupted, and controls an operation of the other interrupter such that a power supply to the interrupter is interrupted.

3 Claims, 5 Drawing Sheets (58) Field of Classification Search
USPC .......................................................... 361/91.1
See application file for complete search history.

(56) References Cited

U.S. PATENT DOCUMENTS

2011/0267726 A1   11/2011   Ikeuchi et al.
2013/0038294 A1    2/2013   Hur
2013/0163134 A1*   6/2013   Ji .......................... H01M 10/42
                                                              361/86

FOREIGN PATENT DOCUMENTS

| JP | 2003-291754 | 10/2003 |
| JP | 2009-112192 | 5/2009 |
| JP | 2010-187532 | 8/2010 |
| JP | 2013-102657 | 5/2013 |
| JP | 2014-017901 | 1/2014 |

* cited by examiner

BATTERY MONITORING DEVICE

TECHNICAL FIELD

The present invention relates to a battery monitoring device that monitors a state of a battery.

RELATED ART

There exists a battery monitoring device that monitors a state of a battery (such as overcharging or overdischarging) that is used in a vehicle, as disclosed in, for example, Patent Document 1.

For example, there also exists a battery monitoring device that includes a monitoring unit that monitors a state of a battery and an interrupter that interrupts a power supply from the battery to a load, wherein, when there occurs an anomaly in the battery, an operation of the interrupter is controlled by the monitoring unit such that a power supply from the battery to the load is interrupted.

CITATION LIST

Patent Document

Patent Document 1: Japanese Laid-open Patent Publication No. 2013-102657

SUMMARY OF INVENTION

Technical Problem

However, in a battery monitoring device that includes a monitoring unit and an interrupter, as described above, there occurs a problem in which, if there exists a failure in the interrupter or if a signal line between the monitoring unit and the interrupter is broken or short circuited, it is not possible to control an operation of the interrupter and this makes it impossible to interrupt a power supply from a battery to a load.

Thus, an object of the present invention is to interrupt a power supply to an interrupter in a battery monitoring device that includes a monitoring unit and the interrupter, so as to interrupt a power supply from a battery to a load even if there occurs a failure in the interrupter or even if a signal line between the monitoring unit and the interrupter is broken or short circuited.

Means for Solving the Problems

A battery monitoring device according to embodiments includes a monitoring unit that monitors a state of a battery, a first interrupter, and a second interrupter.

When a power supply to the first interrupter is interrupted, the first interrupter interrupts a power supply from the battery to a load.

The second interrupter interrupts a power supply to the first interrupter.

The monitoring unit controls an operation of the second interrupter such that a power supply to the first interrupter is interrupted.

Accordingly, if a power supply to the first interrupter is interrupted by the second interrupter, it is possible to interrupt a power supply from the battery to the load even if there occurs a failure in the first interrupter or even if a signal line between the monitoring unit and the first interrupter is broken or short circuited.

Advantageous Effects of Invention

According to the present invention, in a battery monitoring device that includes a monitoring unit and an interrupter, it is possible to interrupt a power supply from a battery to a load even if there occurs a failure in the interrupter or even if a signal line between the monitoring unit and the interrupter is broken or short circuited.

DESCRIPTION OF EMBODIMENTS

Figure 1:
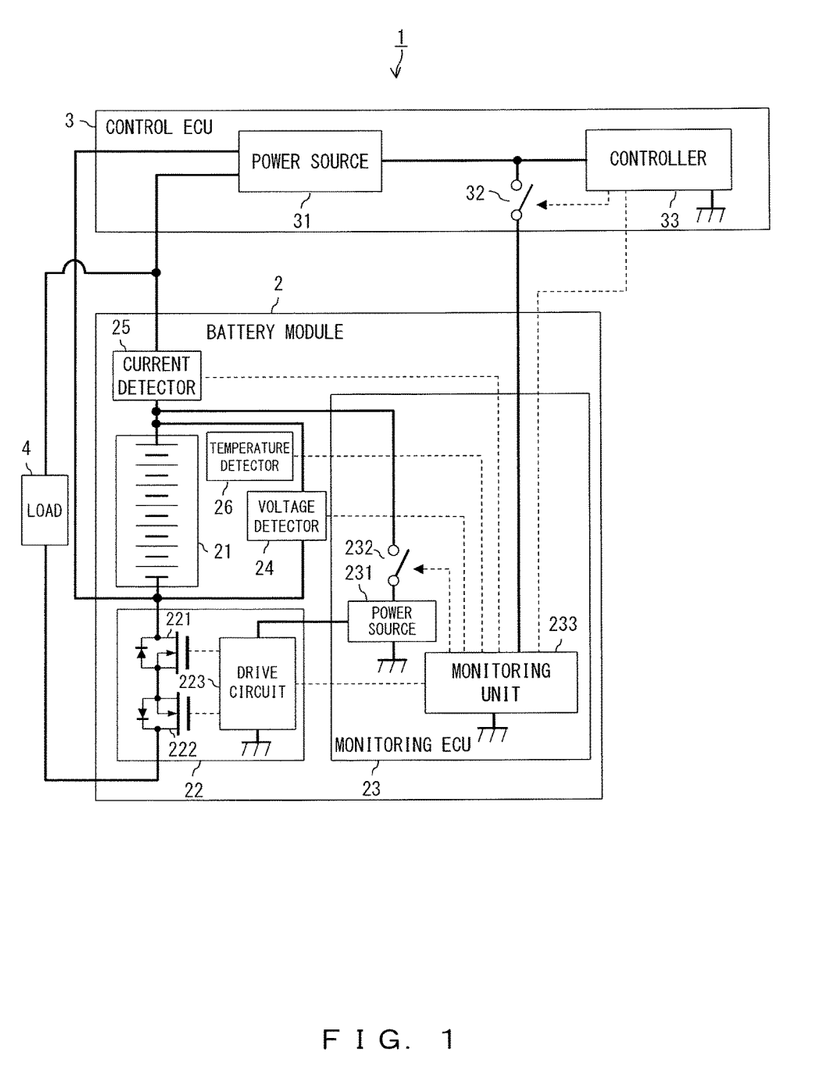
FIG. 1 illustrates an example of a battery pack.

FIG. 1 illustrates an example of a battery pack.

For example, a battery pack 1 illustrated in FIG. 1 is provided in a vehicle (such as an electric forklift, a hybrid vehicle, and an electric vehicle), and includes a battery module 2 and a control ECU (electronic control unit) 3.

The battery module 2 includes a battery 21, an interrupter 22 (a first interrupter), a monitoring ECU 23, a voltage detector 24, a current detector 25, and a temperature detector 26.

The battery 21 is configured to include seven batteries (such as a lithium-ion secondary battery and a nickel-metal hydride battery) that are series-connected to one another. The number of batteries that constitute the battery 21 is not limited to seven.

The interrupter 22 includes MOSFETs (metal oxide semiconductor field effect transistor) 221 and 222 of an N channel, and a drive circuit 223 that controls operations of the MOSFETs 221 and 222. In other words, a drain terminal of the MOSFET 221 is connected to a negative terminal of the battery 21, a source terminal of the MOSFET 221 is connected to a source terminal of the MOSFET 222, and a drain terminal of the MOSFET 222 is connected to the ground. When the MOSFETs 221 and 222 are turned on, power is supplied from the battery 21 to a load 4 (such as a motor for driving a vehicle), and when the MOSFETs 221 and 222 are turned off, a power supply from the battery 21 to the load 4 is interrupted. The MOSFETs 221 and 222 may be replaced with other transistors such as a bipolar transistor or mechanical relays. The interrupter 22 may be provided between a positive terminal of the battery 21 and the load 4. When a power supply to the drive circuit 223 is interrupted, a low-level signal is input to a gate terminal of each of the MOSFETs 221 and 222, the MOSFETs 221 and 222 are turned off, and then a power supply from the battery 21 to the load 4 is interrupted. In other words, the interrupter 22 interrupts a power supply from the battery 21 to the load 4 when a power supply to the interrupter 22 is interrupted.

The voltage detector 24 is constituted of, for example, a voltmeter, and it detects a voltage in the battery 21 and transmits the detected voltage to a monitoring unit 233.

The current detector 25 is constituted of, for example, an ammeter, and it detects a current that flows through the battery 21 and transmits the detected current to the monitoring unit 233.

The temperature detector 26 is constituted of, for example, a thermistor, and it detects a temperature in the battery 21 and transmits the detected temperature to the monitoring unit 233.

The monitoring ECU 23 includes a power source 231, an interrupter 232 (a second interrupter), and the monitoring unit 233.

The power source 231 is constituted of, for example, a DC/DC converter, and supplies power to the drive circuit 223 of the interrupter 22 using power supplied from the battery 21.

The interrupter 232 is constituted of, for example, a transistor or a mechanical relay, and is provided between the battery 21 and the power source 231. Further, the interrupter 232 electrically connects/disconnects the battery 21 to/from the power source 231. When the battery 21 is electrically connected by the interrupter 232 to the power source 231, power is supplied to the drive circuit 223, and when the battery 21 is electrically disconnected by the interrupter 232 from the power source 231, a power supply to the drive circuit 223 is interrupted. The interrupter 232 may be provided between the power source 231 and the interrupter 22.

The monitoring unit 233 is constituted of, for example, a CPU (central processing unit), a multicore CPU, or a programmable device (such as an FPGA (field programmable gate array) and a PLD (programmable logic device)). For example, when it receives a state-information-transmission request transmitted from the control ECU 3, the monitoring unit 233 transmits, to the control ECU 3, the voltage transmitted from the voltage detector 24, the current transmitted from the current detector 25, and the temperature transmitted from the temperature detector 26 as state information that indicates a state of the battery 21.

The control ECU 3 includes a power source 31, an interrupter 32 (a third interrupter), and a controller 33.

The power source 31 is constituted of, for example, a DC/DC converter, and supplies, using power supplied from the battery 21, power to the controller 33, and to the monitoring unit 233 through the interrupter 32.

The interrupter 32 is constituted of, for example, a transistor or a mechanical relay, and is provided between the power source 31 and the monitoring unit 233. Further, the interrupter 32 electrically connects/disconnects the power source 31 to/from the monitoring unit 233. When the power source 31 is electrically connected by the interrupter 32 to the monitoring unit 233, power is supplied to the monitoring unit 233, and when the power source 31 is electrically disconnected by the interrupter 32 from the monitoring unit 233, a power supply to the monitoring unit 233 is interrupted.

Figure 2:
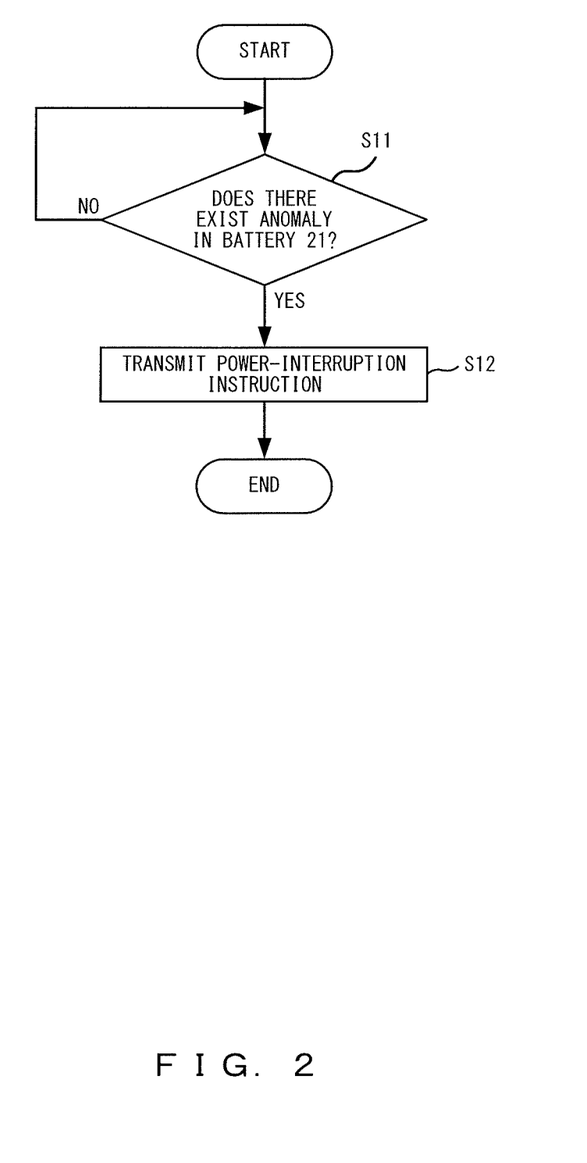
FIG. 2 is a flowchart that illustrates an example of an operation of a controller.

The controller 33 is constituted of, for example, a CPU, a multicore CPU, or a programmable device. For example, the controller 33 transmits a state-information-transmission request to the monitoring unit 233 every time a predetermined period of time elapses. For example, as illustrated in FIG. 2, when it determines, on the basis of state information transmitted from the monitoring unit 233, that there exists an anomaly in the battery 21 (for example, that at least one of a voltage, a current, and a temperature that are indicated by the state information is not less than a threshold) (S11: Yes), the controller 33 transmits, to the monitoring unit 233, a power-interruption instruction indicating that a power supply from the battery 21 to the load 4 is to be interrupted (S12).

<First Embodiment>

A battery monitoring device according to a first embodiment is configured to include, for example, the monitoring unit 233, the interrupter 22, and the interrupter 232.

Figure 3:
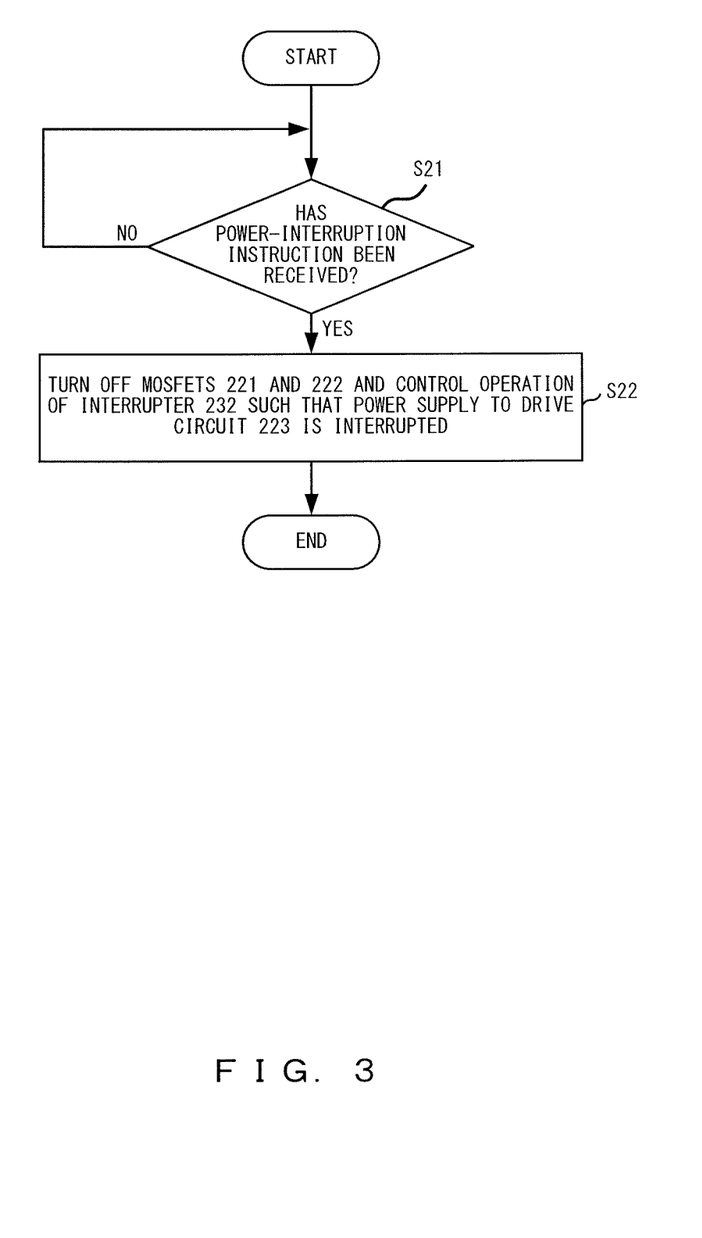
FIG. 3 is a flowchart that illustrates an operation of a monitoring unit in a battery monitoring device according to a first embodiment.

FIG. 3 is a flowchart that illustrates an operation of a monitoring unit 233 in the battery monitoring device according to the first embodiment.

When it receives a power-interruption instruction transmitted from the controller 33 (S21: Yes), the monitoring unit 233 turns off the MOSFETs 221 and 222 through the drive circuit 223, and controls an operation of the interrupter 232, such that a power supply to the drive circuit 223 is interrupted (S22).

In other words, when the monitoring unit 233 receives the power-interruption instruction, the monitoring unit 233 controls an operation of the interrupter 22 through a signal line between the monitoring unit 233 and the interrupter 22 such that a power supply from the battery 21 to the load 4 is interrupted, and controls the operation of the interrupter 232 such that a power supply to the interrupter 22 is interrupted.

The processing of determining whether there exists an anomaly in the battery 21 may be performed in the monitoring unit 233 instead of the controller 33. In such a configuration, when it determines that there exists an anomaly in the battery 21, the monitoring unit 233 controls the operation of the interrupter 22 such that a power supply from the battery 21 to the load 4 is interrupted, and controls the operation of the interrupter 232 such that a power supply to the interrupter 22 is interrupted.

Upon interrupting a power supply from the battery 21 to the load 4, the monitoring unit 233 may control the operation of the interrupter 232 such that a power supply to the interrupter 22 is interrupted at the same time as controlling the operation of the interrupter 22 such that a power supply from the battery 21 to the load 4 is interrupted.

Upon interrupting a power supply from the battery 21 to the load 4, the monitoring unit 233 may control the operation of the interrupter 232 such that a power supply to the interrupter 22 is interrupted after a predetermined period of time has elapsed since it controls the operation of the interrupter 22 such that a power supply from the battery 21 to the load 4 is interrupted.

As described above, in the battery monitoring device according to the first embodiment, upon interrupting a power supply from the battery 21 to the load 4, the monitoring unit 233 controls the operation of the interrupter 232 such that a power supply to the interrupter 22 is interrupted. When a power supply to the interrupter 22 is interrupted, the interrupter 22 interrupts a power supply from the battery 21 to the load 4. This permits a power supply from the battery 21 to the load 4 to be interrupted even if there occurs a failure in the drive circuit 223 of the interrupter 22, or even if a signal line between the monitoring unit 233 and the interrupter 22 is broken or short circuited.

<Second Embodiment>

A battery monitoring device according to a second embodiment is configured to include, for example, the monitoring unit 233, the interrupter 22, the interrupter 232, the interrupter 32, and the controller 33.

Figure 4:
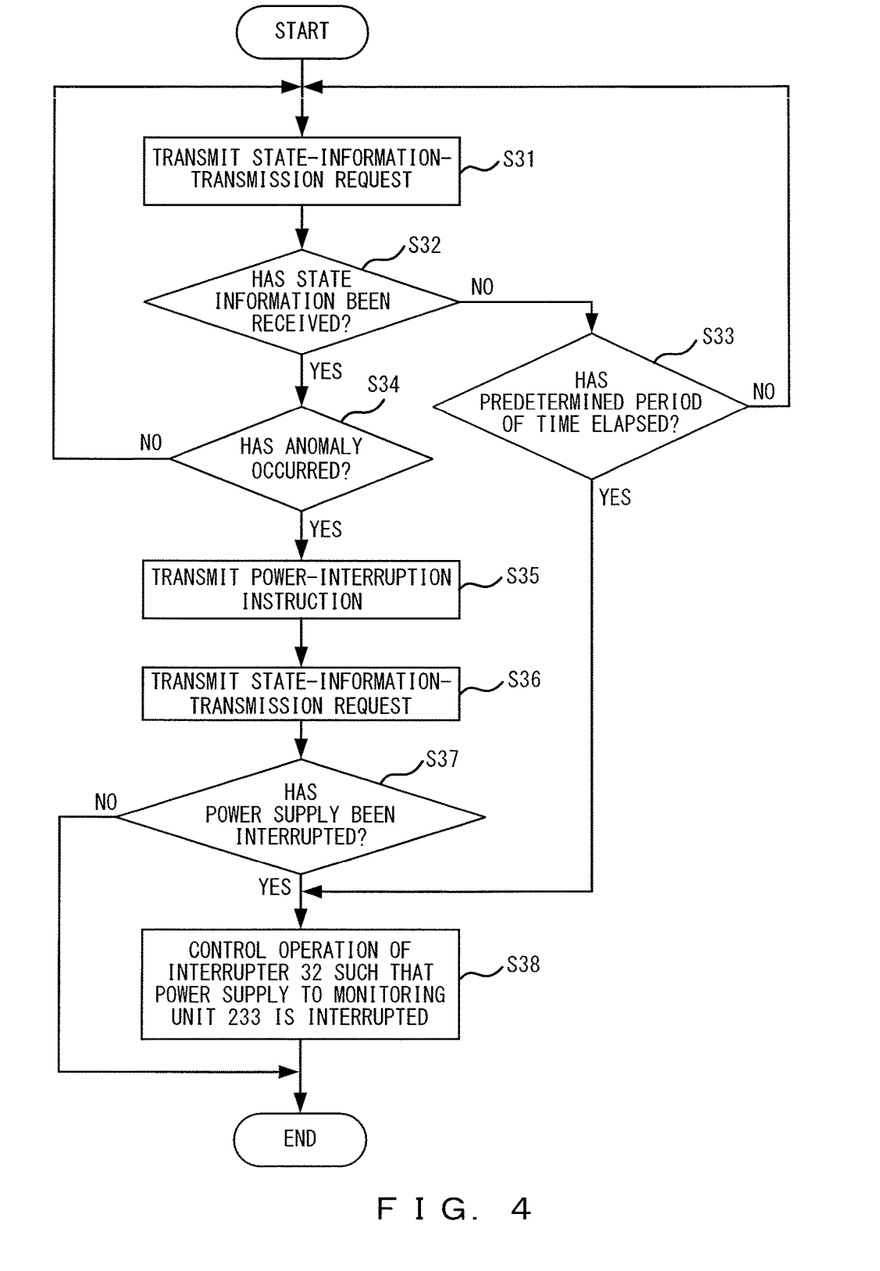
FIG. 4 is a flowchart that illustrates an operation of the controller in a battery monitoring device according to a second embodiment.

FIG. 4 is a flowchart that illustrates an operation of the controller 33 in the battery monitoring device according to the second embodiment.

First, when the controller 33 receives state information from the monitoring unit 233 (S32: Yes) during a period from when it transmits a state-information-transmission request to the monitoring unit 233 to when a predetermined period of time elapses (S31 to S33), the controller 33 determines whether there exists an anomaly in the battery 21 (S34).

Next, when it determines that there does not exist an anomaly in the battery 21 (S34: No), the process returns to S31 and the controller 33 transmits the state-information-transmission request to the monitoring unit 233 (S31).

When it determines that there exists an anomaly in the battery 21 (S34: Yes), the controller 33 transmits a power-interruption instruction to the monitoring unit 233 (S35), and then transmits a state-information-transmission request to the monitoring unit 233 (S36), so as to determine, on the basis of the state information transmitted from the monitoring unit 233, whether a power supply from the battery 21 to the load 4 has been interrupted (S37).

Next, when it determines that a power supply from the battery 21 to the load 4 has been interrupted (S37: No), the controller 33 terminates the processing without controlling an operation of the interrupter 32. For example, when the current indicated by the state information transmitted from the monitoring unit 233 is not greater than the threshold, the controller 33 determines that a power supply from the battery 21 to the load 4 has been interrupted.

When it determines that a power supply from the battery 21 to the load 4 has not been interrupted (S37: Yes), the controller 33 controls the operation of the interrupter 32 such that a power supply to the monitoring unit 233 is interrupted (S38). For example, when the current indicated by the state information transmitted from the monitoring unit 233 is greater than the threshold, the controller 33 determines that a power supply from the battery 21 to the load 4 has not been interrupted.

When the controller 33 does not receive the state information after the predetermined period of time has elapsed, since it transmits the state-information-transmission request to the monitoring unit 233 (S32: No, S33: Yes), the controller 33 controls the operation of the interrupter 32 such that a power supply to the monitoring unit 233 is interrupted (S38).

When a power supply to the monitoring unit 233 is interrupted and the monitoring unit 233 is stopped, the level of a signal output from the monitoring unit 233 to the gate terminal of each of the MOSFETs 221 and 222 through the drive circuit 223 becomes low, and the MOSFETs 221 and 222 are turned off. When the monitoring unit 233 is stopped, a power supply to the drive circuit 223 is interrupted by the interrupter 232, the level of the signal output from the drive circuit 223 to the gate terminal of each of the MOSFETs 221 and 222 becomes low, and the MOSFETs 221 and 222 are turned off.

As described above, in the battery monitoring device according to the second embodiment, when a power supply from the battery 21 to the load 4 is not interrupted even if the controller 33 transmits a power-interruption instruction to the monitoring unit 233, the controller 33 controls the operation of the interrupter 32 such that a power supply to the monitoring unit 233 is interrupted. When a power supply to the monitoring unit 233 is interrupted and the monitoring unit 233 is stopped, the MOSFETs 221 and 222 are turned off. This permits a power supply from the battery 21 to the load 4 to be interrupted even when a communication interruption has not occurred between the monitoring unit 233 and the controller 33 but it is not possible to control an operation of the drive circuit 223 or the operation of the interrupter 232 due to a failure in the monitoring unit 233.

Further, in the battery monitoring device according to the second embodiment, when it does not receive state information, the controller 33 controls the operation of the interrupter 32 such that a power supply to the monitoring unit 233 is interrupted. When a power supply to the monitoring unit 233 is interrupted and the monitoring unit 233 is stopped, the MOSFETs 221 and 222 are turned off. This permits a power supply from the battery 21 to the load 4 to be interrupted even when a communication interruption has occurred between the monitoring unit 233 and the controller 33.

Figure 5:
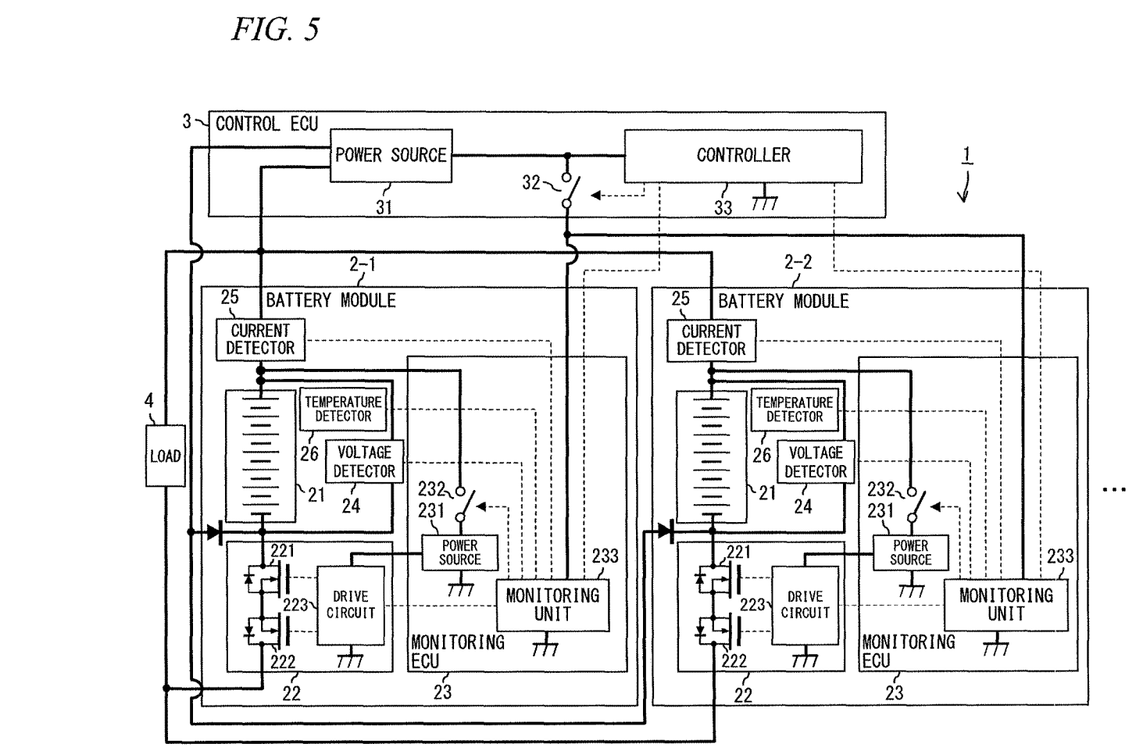
FIG. 5 illustrates another example of the battery pack.

Furthermore, in the above-described battery monitoring devices according to the first and second embodiments, the battery pack 1 is configured to include one battery module 2, but, for example, it may be configured to include a plurality of battery modules 2 (2-1, 2-2, . . . ), as illustrated in FIG. 5. In such a configuration, batteries 21 may be connected in parallel to one another. Power terminals of the monitoring units 233 of the respective battery modules 2 are connected to one another, and the interrupter 32 is provided between the connection point and the power source 31. When the controller 33 determines, on the basis of state information transmitted from the monitoring unit 233 of each of the battery modules 2, that an anomaly has occurred in at least one of the batteries 21 in the respective battery modules 2, the controller 33 transmits a power-interruption signal to the monitoring units 233 of the respective battery modules 2.

Moreover, in the above-described battery monitoring devices according to the first and second embodiments, the interrupter 32 may interrupt a power supply to the monitoring unit 233 upon moving on to a power save mode, so as to be used to reduce a power consumption of the battery 21 in addition to being used to interrupt a power supply from battery 21 to the load 4.

REFERENCE SIGNS LIST 1 battery pack
2 battery module
3 control ECU
4 load
21 battery
22,232,32 interrupter
23 monitoring ECU
24 voltage detector
25 current detector
26 temperature detector
221,222 MOSFET
223 drive circuit
231 power source
233 monitoring unit
31 power source
33 controller

The invention claimed is:
1. A battery monitoring device comprising:
a monitor configured to monitor a state of a battery;
a first interrupter configured to interrupt a power supply from the battery to a load when a power supply to the first interrupter is interrupted;
a power source configured to supply power to the first interrupter;
a second interrupter configured to interrupt a power supply from the power source to the first interrupter;
a communication line configured to connect the monitor and the first interrupter without intervention of the second interrupter; and a controller configured to receive state information transmitted from the monitor, the state information indicating a state of the battery, wherein when the controller determines, on the basis of the state information, that there exists an anomaly in the battery, the controller transmits a power-interruption instruction to the monitor, and when the monitor receives the power-interruption instruction from the controller,     the monitor controls an operation of the first interrupter through the communication line such that a power supply from the battery to the load is interrupted, and     the monitor controls an operation of the second interrupter such that a power supply from the power source to the first interrupter is interrupted.

2. The battery monitoring device according to claim 1, comprising:

a third interrupter configured to interrupt a power supply to the monitor, wherein when a power supply to the load is not interrupted even if the controller transmits the power-interruption instruction to the monitor, the controller controls the operation of the third interrupter such that a power supply to the monitor is interrupted, and when a power supply to the monitor is interrupted, the monitor performs a control to interrupt the first interrupter through the communication line, and interrupts the second interrupter.

3. The battery monitoring device according to claim 1, comprising:

a third interrupter configured to interrupt a power supply to the monitor, wherein the monitor transmits state information that indicates the state of the battery to the controller, when the controller does not receive the state information, the controller controls the operation of the third interrupter such that a power supply to the monitor is interrupted, and when a power supply to the monitor is interrupted, the monitor performs a control to interrupt the first interrupter through the communication line, and interrupts the second interrupter.

* * * * *